United States Patent [19]  
Ito et al.

[11] Patent Number: 4,903,119  
[45] Date of Patent: Feb. 20, 1990

[54] SEMI-CONDUCTOR DEVICE

[75] Inventors: Satoshi Ito; Akiko Kitayama; Takatoshi Hamada; Miho Yamaguchi, all of Osaka, Japan

[73] Assignee: Nitto Electric Industrial Co., Ltd., Osaka, Japan

[21] Appl. No.: 328,712

[22] Filed: Mar. 27, 1989

Related U.S. Application Data

[63] Continuation of Ser. No. 44,546, May 1, 1987, abandoned.

[30] Foreign Application Priority Data

May 1, 1986 [JP] Japan ................................ 61-101752

[51] Int. Cl.⁴ ............................................. H01L 23/28
[52] U.S. Cl. ...................................... 357/72; 174/52.2
[58] Field of Search ...................... 357/72; 174/52.2; 264/272.11

[56] References Cited

U.S. PATENT DOCUMENTS

| 2,913,358 | 11/1959 | Harrington et al. ............... 357/72 X |
| 4,001,870 | 1/1977 | Saiki et al. ............................ 357/72 |
| 4,327,369 | 4/1982 | Kaplan .................................... 357/72 |

FOREIGN PATENT DOCUMENTS

| 58-225120 | 12/1983 | Japan ..................................... 357/72 |
| 59-48942 | 3/1984 | Japan ..................................... 357/72 |
| 60-4527 | 1/1985 | Japan ..................................... 357/72 |
| 60-18517 | 1/1985 | Japan ..................................... 357/72 |

Primary Examiner—Andrew J. James  
Assistant Examiner—Sara W. Crane  
Attorney, Agent, or Firm—Sughrue, Mion, Zinn, Macpeak & Seas

[57] ABSTRACT

A semi-conductor device in which a semi-conductor element is sealed with a molding resin is disclosed. In the device, adhesion between a semi-conductor chip and the molding resin is achieved mainly by oxygen-crosslinking between silicon in the semi-conductor chip and silicon in the molding resin. The device exhibits excellent moisture-resistant reliability even after mounting.

3 Claims, 1 Drawing Sheet

SEMI-CONDUCTOR DEVICE

This is a continuation of application Ser. No. 044,546 filed 5/1/87, now abandoned.

FIELD OF THE INVENTION

The present invention relates to a semi-conductor device having an excellent-moisture resistant reliability after mounting.

BACKGROUND OF THE INVENTION

Semi-conductor devices have been conventionally produced by sealing a semi-conductor element, such as transistors, IC, and LSI, in a ceramic package, etc., but in recent years, the ceramic package is shifted to a resin sealing using a plastic package comprising an epoxy resin as a main component from the standpoint of cost and mass production. In particular, for the purpose of achieving high-density mounting on a hybrid substrate, efforts have been made to reduce the size and thickness of semi-conductor devices. To this effect, sealing by surface-mount type plastic packages such as PLCC (Plastic-Leaded Chip Carrier), SOP (Small Out-line Package), FP (Flat Package), and the like, has lately attracted attention and been widely applied to practical use.

Since the above-described surface mounting, unlike mounting by pin-insertion type DIP (Dual In-line Package), is a technique such that a package is directly soldered on a substrate, the package is heated on mounting to a temperature in the range between 210° C. and 260° C., which is a melting point of the solder, by vapor phase heating or infrared heating. Therefore, the most serious problem encountered with the surface mount type package is that the moisture-resistant reliability of the resulting semi-conductor device after mounting is greatly reduced. That is, a thermal stress arising from thermal shock at the time of mounting and a stress arising from evaporation of moisture present within the package cause separation between a molding resin and a lead frame or between a chip of a semi-conductor element and a molding resin to thereby form a gap therebetween. As a result, outside moisture penetrates into the inside of the semi-conductor device through the gap to seriously reduce the moisture-resistant reliability after mounting.

BRIEF DESCRIPTION OF THE ACCOMPANYING DRAWINGS

FIGS. 1, 2 and 3 each shows a diagram illustrating steps for the formation of an oxygencrosslinking structure;

FIGS. 4 and 5 each shows on ESCA spectrum of the semi-conductor chip or the molding resin; and FIGS. 6 and 7 illustrate the method for testing adhesive strength between the semi-conductor chip and the molding resin.

The inventors have conducted a series of studies aiming at reduction or removal of the thermal stress of the package and the stress due to moisture evaporation within the package which cause reduction of moisture-resistant reliability of the surface-mount type package. One subject of the studies was to greatly improve adhesive strength between a semi-conductor chip and a molding resin, and another subject was to reduce the thermal stress on the interface between the semi-conductor chip and the molding resin at the time of mounting. As a result of the studies, it has now been found that a markedly increased adhesive strength of the molding resin can be attained through chemical bonding between silicon in the semi-conductor chip and silicon in the molding resin by an oxygen-crosslinking. It has also been found that the above effect can be further enhanced by imparting a stress relaxation function to the molding resin. The present invention has been completed based on these findings.

SUMMARY OF THE INVENTION

Accordingly, an object of the present invention is to provide a semi-conductor device which can withstand thermal shock at the time of surface mounting and does not suffer from reduction in moisture-resistant reliability after mounting.

The semi-conductor device according to the present invention is a semi-conductor device comprising a semi-conductor element sealed with a molding resin, wherein adhesion between a semi-conductor chip in the semi-conductor device and the molding resin is effected mainly by oxygen-crosslinking between silicon in the semi-conductor chip and silicon in the molding resin.

According to the semi-conductor device of the present invention, strong adhesion between the semi-conductor chip and the molding resin is achieved by chemical bonding of oxygen-crosslinking between silicon distributed on the surface and throughout the inside of the semi-conductor chip and silicon distributed on the surface and throughout the inside of the molding resin. Therefore, the semi-conductor element sufficiently withstands a severe thermal shock after mounting to retain its moisture-resistant reliability.

DETAILED DESCRIPTION OF THE INVENTION

Figure 1:
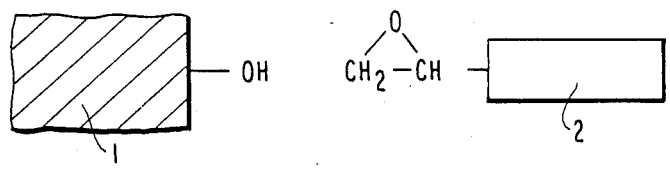

The term "mainly" as used herein means to include the embodiment that adhesion is effected by only the oxygen-crosslinking.

The semi-conductor device according to the present invention can be obtained by sealing a semi-conductor element with an epoxy resin composition by conventional molding method, such as a usual transfer molding method, and the like.

The epoxy resin composition which can be used as a molding material comprises an epoxy resin and a phenolic resin in at least one of which a silane compound, e.g., a silane coupling agent, has been introduced by preliminary reaction, a curing accelerator, etc., and usually has a form of powder or tablet punched out from the powder.

The epoxy resin which can be used is not particularly limited and includes various epoxy resins conventionally employed for sealing of semi-conductor devices, such as a cresol novolak type, a phenol novolak type, a bisphenol A type, and the like. Of these epoxy resins, those having a melting point above room temperature and which are solid or highly viscous solutions at room temperature or lower temperatures are preferably used. Examples of the epoxy-novolak resins generally include cresol novolak type epoxy resins and alkylated phenol novolak type epoxy resins having an alkyl group (e.g., a t-butyl group, a methyl group, etc.) on the phenol nucleus. These epoxy-novolak resins preferably have an epoxy equivalent of from 160 to 300 and a softening point of from 50° to 130° C.

The phenolic resin which can be used in combination with the epoxy resin serves as a curing agent for the epoxy resin, and suitably includes a phenolic novolak, a cresol novolak, and an alkylated phenolic novolak having an alkyl group (e.g., a t-butyl group, etc.) added to the phenol nucleus. These phenolic novolak resins preferably have a softening point of from 50° to 110° C. and a hydroxyl equivalent of from 70 to 180.

Any one or more of conventionally employed curing accelerators can be used in the present invention. Preferred examples of curing accelerators which can be used include tertiary amines, e.g., triethanolamine, tetramethylhexanediamine, triethylenediamine, dimethylaniline, dimethylaminoethanol, diethylaminoethanol, 2,4,6-(dimethylaminomethyl)phenol, N,N'-dimethylpiperazine, pyridine, picoline, 1,8-diazabicyclo(5,4,0)-undecene-7, benzyldimethylamine, 2-(dimethylamino)-methylphenol, etc.; quaternary ammonium salts, e.g., dodecyltrimethylammonium iodide, cetyltrimethylammonium chloride, benzyldimethyltetrabutylammonium chloride, stearyltrimethylammonium chloride, etc.; imidazoles, e.g., 2-methylimidazole, 2-undecylimidazole, 2-ethylimidazole, 1-benzyl-2-methylimidazole, 1-cyanoethyl-2-undecylimidazole, etc.; and boron compounds, e.g., tetraphenylboron, tetraphenylborate, N-methylmorpholinetetraphenylborate, etc.

If desired, the epoxy resin composition may further comprise a releasing agent, an inorganic filler, a flame retardant, e.g., antimony trioxide and a phosphorus compound, a silane compound, e.g., a silane coupling agent, a pigment, and a polysiloxane.

In the present invention, the epoxy resin and/or the phenolic resin, main components of the epoxy resin composition, are previously modified by preliminary reaction with a silane compound, such as a silane coupling agent. It is also possible to use such a silane-modified epoxy resin or phenol resin in an appropriate combination with a silane compound, such as a silane coupling agent. In this case, the silane compound which is used in combination functions as a coupling agent for an inorganic filler.

Examples of the releasing agent which can be used include conventional long-chain carboxylic acids, e.g., stearic acid and palmitic acid; metal salts of long-chain carboxylic acids, e.g., zinc stearate and calcium stearate; and waxes, e.g., carnauba wax and montan wax; and the like.

The inorganic filler which can be used is not particularly limited and the examples thereof include those commonly employed, such as ground quartz glass, talc, silica flours, alumina powders, and the like.

As described above, at least one of the epoxy resin and the phenolic resin which are the main components of the molding epoxy resin composition are modified by preliminarily reacting those with a silane compound such as a silane coupling agent. As a result, silicon in the semi-conductor chip and silicon in the molding resin are oxygen-crosslinked to develop a strong adhesive force. This is the greatest feature of the present invention.

The silane compound which can be used for modifying the epoxy and/or phenolic resin includes silane compounds having a functional group, e.g., an amino group, a mercapto group, a glycidyl group, a hydroxyl group, a carboxyl group, etc. Typical examples of such silane compounds are (1) N-(2-aminoethyl)-3-aminopropylmethyldimethoxysilane, (2) N-(2-aminoethyl)-3-aminopropyltrimethoxysilane, (3) 3-aminopropyltrimethoxysilane, (4) 3-aminopropylmethyldiethoxysilane, (5) 3-glycidoxypropyltrimethoxysilane, (6) 3-glycidoxypropylmethyldimethoxysilane, (7) 2-(3,4-epoxycyclohexyl)ethyltrimethoxysilane, and (8) 3-mercaptopropyltrimethoxysilane. Of these, (1) to (4) and (8) can be used for modifying epoxy resins, and (1) to (7) can be used for phenolic resins.

The preliminary reaction for modifying the epoxy and/or phenolic resin is preferably carried out by heating the epoxy resin and/or phenolic novolak to be modified at a temperature above its softening point, and particularly to a temperature between 130° and 170° C. The amount of the silane compound used for modification preferably ranges from 0.03 to 15%, and more preferably from 0.15 to 3.0%, by weight based on the weight of the organic components in the epoxy resin composition. If it is out of this range, it is difficult to obtain satisfactory results.

In a preferred embodiment of the present invention, a molding resin having a bending modulus of elasticity of from 50 to 300 Kgf/mm$^2$ at 170° C. is employed. Such a resin exhibits a stress relaxation effect at high temperatures to further enhance the moisture-resistant reliability of the semi-conductor device.

In general, epoxy resin compositions for molding are generally molded at a temperature ranging from 160° to 180° C., followed by postcuring at that temperature for a period of from several to ten-odd hours. Actual mounting of a semi-conductor element is carried out after the postcuring. The conventional epoxy resin compositions after the postcuring have a bending modulus of elasticity of from 300 to 800 kgf/mm$^2$ at 170° C., at which temperature the bending modulus of elasticity is much more correlated to moisture-resistant reliability that at any other temperatures. To have a higher bending modulus of elasticity is to cause a greater thermal stress at temperatures for soldering, i.e., from 215° to 260° C. Therefore, use of the abovedescribed molding resin whose bending modulus of elasticity at 170° C. ranges from 50 to 300 Kgf/mm$^2$ contributes to enhancement of moisture-resistant reliability after solder-mounting in operation with the above-described oxygen-crosslinking structure. The lower limit of the modulus at 170° C. is set at 50 Kgf/mm$^2$ from the standpoint of protection of a semi-conductor element. That is, if it is smaller than 50 Kgf/mm$^2$, there is a fear that moisture-resistant reliability after solder-mounting might be deteriorated.

Methods for decreasing the modulus of the resin composition at 170° C. to 300 Kgf/mm$^2$ or smaller include (i) decreasing an amount of a curing accelerator, (ii) shortening a time for postcuring or eliminating the postcuring, (iii) changing an epoxyphenolic hydroxyl equivalent ratio from 1:1, (iv) using a low-softening epoxy and/or phenolic resin, and (v) using an epoxynovolak resin and/or phenolic novolak having a functional group suppressing a reaction of the epoxy and/or phenol moiety.

For example, a standard epoxy resin composition is molded at 175° C. for 2 minutes and postcured at 175° C. for 5 hours, and the composition has a bending modulus of elasticity of 520 Kgf/mm$^2$ as determined at 170° C. When each of the above-described methods was applied to the same standard epoxy resin composition, the postcured composition was turned out to have a markedly decreased bending modulus of elasticity at 170° C. as shown in Table 1 below.

TABLE 1

| Method | Detail | Bending Modulus of Elasticity (170° C.) |
|---|---|---|
| (i) | The amount of a curing accelerator was decreased to ⅓. | 240 |
| (ii) | No postcuring was performed. | 130 |
| (iii) | Epoxy/hydroxyl equivalent ratio = 1/1.3 | 170 |
| (iv) | An epoxy resin and a phenolic resin each having a softening point decreased by 15° C. were used. | 160 |
| (v) | An o-cresol novolak was used. | 230 |

The epoxy resin composition which can be used in the present invention can be prepared, for example, as follows. An epoxy resin or phenolic resin is modified by preliminarily reacting with a silane compound, e.g., a silane coupling agent, and the resulting modified resin is mixed with the above-described curing accelerator and other additives. The resulting mixture is meltkneaded under heat in an appropriate kneading machine, e.g., a mixing roll. If desired, the composition may be punched out into tablets.

Figure 2:
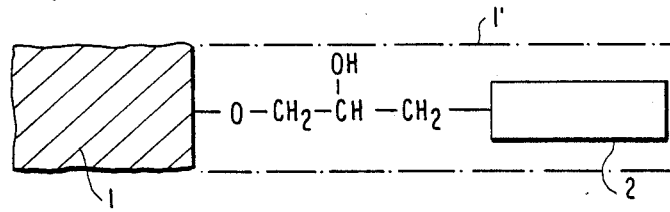
Figure 3:
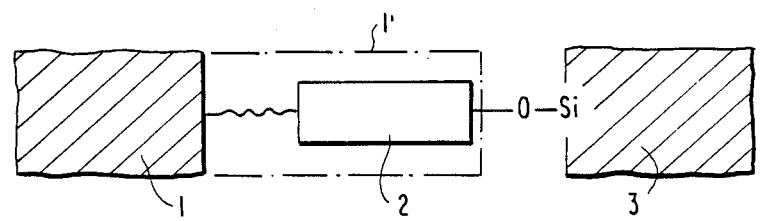

The preliminary reaction system between an epoxy or phenolic resin and a silane compound and the formation of an oxygen-crosslinking structure will be explained below by reference to FIGS. 1 through 3. FIG. 1 illustrates the stage before the preliminary reaction, in which a hydroxyl group of an epoxy or phenolic resin 1 and a functional group of a silane compound 2 are present. Upon reaction therebetween, the silane compound 2 is introduced into the molecular structure of the resin 1 to form a modified resin 1' (indicated by a dotted line) as shown in FIG. 2.

The epoxy resin composition obtained by the above reaction thus comprises the epoxy resin and the phenolic resin at least one of which has been modified by introduction of the silane compound. The method for sealing a semi-conductor element with such an epoxy resin composition containing the silane-modified resin is not particularly restricted and may be carried out by any of known molding methods, such as transfer molding. The silane compound 2 in the modified resin and silicon in a semi-conductor chip 3 in a semi-conductor element are reacted upon heat molding as shown in FIG. 3, whereby silicon present in the silane compound 2 and silicon in the semi-conductor chip 3 are chemically bonded through an oxygen-crosslinking. Accordingly, a highly strong adhesion between the molding resin 1' and the semi-conductor chip 3 can be achieved by the chemical bonding based on the oxygen-crosslinking structure.

Since the semi-conductor devices according to the present invention do not suffer from separation between a semi-conductor chip and a molding resin even on receipt of a thermal shock, etc. during surface mounting due to the strong adhesion, the moisture-resistant reliability of the devices is not substantially reduced by mounting.

Figure 4A:
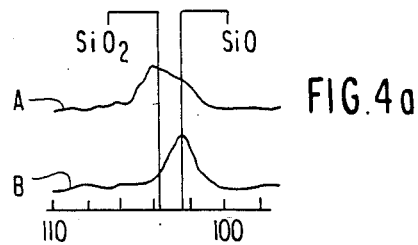
Figure 4B:
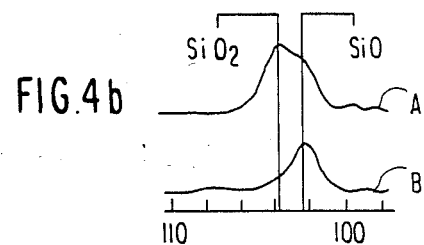
Figure 5A:
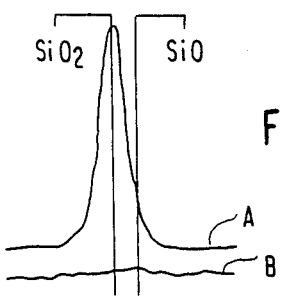
Figure 5B:
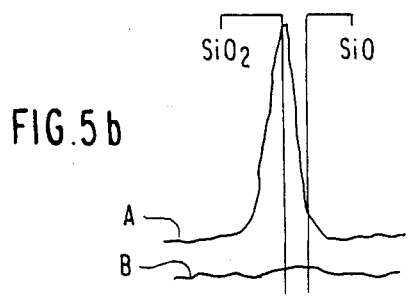

The fact that the molding resin and the semi-conductor chip are chemically bonded through an oxygen-crosslinking can be confirmed through surface analysis by ESCA (X-ray Photoelectron Spectroscopy). That is, when a joint between the molding resin and the semi-conductor chip over which an oxygen-crosslinking is formed is separated at a high temperature around 250° C. and subjected to ESCA (XPS), an SiO peak appears in both of the semi-conductor chip and the molding resin. FIG. 4-(a) shows the result of an ESCA analysis of a semi-conductor device sample according to the present invention after separating under high temperature and before it is mounted, and FIG. 4-(b) shows the result of an ESCA analysis of the same sample after it is solder-dipped. FIGS. 5-(a) and (b) show the results of ESCA analysis of conventional semi-conductor elements in which no oxygen-crosslinking structure is not formed over the joint between the semi-conductor chip and the molding resin. In these figures, the curve A and B indicate a spectrum of the semi-conductor chip and that of the molding resin, respectively. As is apparent from FIGS. 4 in view of FIGS. 5, in the case where an oxygen-crosslinking is formed over the joint, an SiO peak appears in both of the chip and the resin before mounting, and no substantial change is observed even after solder-dipping; while no peak of SiO appears in either of the chip or the molding resin in the case of the conventional element having no oxygen-crosslinking structure.

As described above, the semi-conductor devices in accordance with the present invention are free from separation between a semi-conductor chip and a molding resin upon receipt of a thermal shock, etc. during mounting because of the strong adhesion therebetween attributed mainly to an oxygen-crosslinking between silicon of the chip and silicon of the resin. Hence, the semi-conductor devices of the present invention retain their excellent moisture-resistant reliability even after mounting. In other words, the present invention can eliminate the problem of reduction in moisture-resistant reliability after mounting, which has been the most serious problem in the surface-mount type packages of semi-conductor devices, thus making it possible to further reduce size and thickness of various electronic equipments using semi-conductor devices.

The present invention will now be illustrated in greater detail by the reference of the following examples and comparative examples, but it should be understood that the present invention is not limited thereto. In those examples, all the percents are by weight unless otherwise indicated.

EXAMPLES 1 TO 7 AND COMPARATIVE EXAMPLES 1 TO 6

Components shown in Table 2 below were mixed at the indicated compounding ratio together with 70% of fusible silica as an inorganic filler, 2% of antimony trioxide, 0.3% of carbon, and 0.5% of carnauba wax, each percent being based on the total weight of the resulting resin composition.

The abbreviations used in Table 2 have the following meanings:

E-1: N-(2-Aminoethyl)-3-aminopropylmethyldimethoxysilane
E-2: 3-Glycidoxypropylmethyldimethoxysilane
E-3: 3-Mercaptopropyltrimethoxysilane
E-4: Methyltrimethoxysilane
H-1: 2-Methylimidazole
H-2: N,N'-Dimethylpiperazine The epoxy resin used in each of Examples 1, 3, 4, and 5 had been modified by preliminary reaction with the indicated silane compound. The phenolic resin used in each of Examples 2, 6 and 7 had been modified by preliminary reaction with the indicated silane compound. The preliminary reaction was carried out at 170° C. for a period of from 0.5 to 2 hours. In Example 7, the modified phenolic resin (modified with E-2) was mixed with the filler in combination with the silane compound (E-4). Comparative Examples 1, 5 and 6 show the case of not using the silane compound. Comparative Example 2 shows the case where the silane compound and the filler were preliminarily mixed, and the resulting mixture was employed as an ordinary filler. Comparative Example 3 shows the case where an attempt for modifying the epoxy resin with the silane compound failed due to lack of reactivity of the silane compound used so that the resulting composition contained the epoxy resin remaining unmodified and the silane compound.

Each of the resulting compounded resins was kneaded in a hot roll at 120° C. for 5 minutes, cooled, and ground to obtain a powdery epoxy resin composition.

The powdery epoxy resin composition was molded at 175° C. for 2 minutes. Immediately thereafter or after postcuring at 175° C. for 5 hours, the composition was formed in a package.

The epoxy resin composition thus molded was evaluated for adhesion to a semi-conductor chip, presence of an SiO peak after removal of a semi-conductor chip, bending modulus of elasticity at 170° C., and durability under a high-moisture condition after solder-dipping. The evaluations were conducted according to the methods described below. The results obtained are shown in Table 2.

Figure 6:
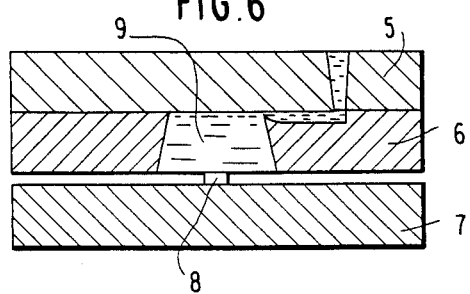

(1) Adhesion:

The epoxy resin composition was transfermolded in a transfer mold as shown in FIG. 6 which was composed of an upper mold 5, an intermediate mold 6, and a lower mold 7 at a temperature of 175° C., under a pressure of 70 Kg/cm$^2$, for a period of 2 minutes to obtain a molded article comprising a cured resin 9 adhered to a semi-conductor chip 8. The semi-conductor chip 11 of the resulting molded article 10 was pushed out by means of a push-pull gauge 12 as shown in FIG. 7 to determine an adhesive strength.

Figure 7:
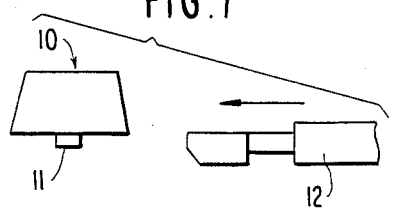

(2) Confirmation of SiO Peak by ESCA:

After a resin-sealed semi-conductor as obtained in (1) above was preheated at 250° C., the semi-conductor chip and the molding resin were separated apart on the interface therebetween by means of a push-pull gauge 12 as shown in FIG. 7. Both the exposed surfaces were subjected to ESCA as soon as possible so that the surfaces might not be contaminated. In analyzing, attention was given to a $C_{1s}$ peak and an $Si_{2p}$ peak to examine whether an SiO peak appears or not. When the ratio of an SiO peak area to a $C_{1s}$ peak area was 0.02 or more, such a spectrum was regarded to have an SiO peak.

(3) Bending Modulus of Elasticity at 170° C.:

Bending test was conducted at 170° C. in accordance with JIS 6911 to determine a bending modulus of elasticity at that temperature.

(4) Pressure Cooker Test after Solder-Dipping (SD-PCT):

A linear IC was packaged to obtain an 8-pin SOP under the same molding conditions as in (1) above. After the package was put in an atmosphere of 80° C. and 85% RH for 20 hours to absorb moisture, it was dipped in a solder at 260° C. for 10 seconds. The resulting soldered package was subjected to pressure cooker test (PCT) to determine a mean time between failure(MTBF).

TABLE 2

| | Example No. | | | | | | |
|---|---|---|---|---|---|---|---|
| | 1 | 2 | 3 | 4 | 5 | 6 | 7 |
| Epoxy Resin (Softening Point: °C.) | epoxy cresol novolak (68) | epoxy cresol novolak (100) | epoxy cresol novolak (68) | epoxy cresol novolak (68) | epoxy cresol novolak (100) | epoxy cresol novolak (68) | epoxy cresol novolak (68) |
| Phenolic Resin (Softening Point: °C.) | phenol novolak (57) | phenol novolak (87) | phenol novolak (57) | cresol novolak (62) | phenol novolak (87) | cresol novolak (57) | cresol novolak (57) |
| Epoxy/Hydroxyl Equivalent Ratio | 1/1 | 1/1 | 1/1 | 1/1 | 1/1 | 1/1 | 1/1 |
| Silane Compound (Amount: wt %*) | E-1 (0.3) | E-2 (0.3) | E-3 (1.5) | E-1 (0.03) | E-3 (0.015) | E-2 (6.0) | E-2/E-4 (1.5/0.3) |
| Method of Using Silane Compound | A*** | A | A | A | A | A | A/B*** |
| Curing Accelerator (Amount: part by weight**) | H-1 (3.0) | H-1 (1.0) | H-2 (3.0) | H-1 (3.0) | H-1 (3.0) | H-1 (3.0) | H-1 (3.0) |
| Postcuring | done | done | undone | done | done | done | done |
| Adhesive Strength (Kgf/mm$^2$) | 0.5 | 0.5 | 0.5 | 0.5 | 0.5 | 0.5 | 0.5 |
| SiO Peak in ESCA [resin side/chip side] | shown/shown | shown/shown | shown/shown | shown/shown | shown/shown | shown/shown | shown/shown |
| Modulus in Flexure at 170° C. (Kg/mm$^2$) | 150 | 380 | 90 | 130 | 470 | 150 | 150 |
| MTBF (hr) in SD PCT | 1400 | 700 | 1300 | 900 | 800 | 1400 | 1500 |

| | Comparative Example No. | | | | | |
|---|---|---|---|---|---|---|
| | 1 | 2 | 3 | 4 | 5 | 6 |
| Epoxy Resin (Softening Point: °C.) | epoxy cresol novolak (100) | epoxy cresol novolak (68) | epoxy cresol novolak (68) | xylenol-terminated epoxy cresol novolak | xylenol-terminated epoxy cresol novolak | xylenol-terminated epoxy cresol novolak |

TABLE 2-continued

| Phenolic Resin (Softening Point: °C.) | phenol novolak (87) | phenol novolak (57) | phenol novolak (57) | (98) cresol novolak (98) | (98) cresol novolak (98) | (98) cresol novolak (62) |
|---|---|---|---|---|---|---|
| Epoxy/Hydroxyl Equivalent Ratio | 1/1 | 1/1 | 1/1 | 1/1 | 1/1 | 1/1 |
| Silane Compound (Amount: wt %*) | — | E-4 (1.5) | E-1 (0.3) | E-1 (0.3) | — | — |
| Method of Using Silane Compound | — | B | B | B | — | — |
| Curing Accelerator (Amount: part by weight**) | H-1 (3.0) | H-2 (3.0) | H-1 (3.0) | H-1 (3.0) | H-1 (3.0) | H-1 (3.0) |
| Postcuring | done | done | done | done | done | done |
| Adhesive Strength (Kgf/mm$^2$) | 0.12 | 0.18 | 0.16 | 0.14 | 0.12 | 0.15 |
| SiO Peak in ESCA [resin side/chip side] | not shown/ not shown | shown/ not shown | not shown/ not shown | not shown/ not shown | not shown/ not shown | not shown/ not shown |
| Modulus in Flexure at 170° C. (Kg/mm$^2$) | 450 | 170 | 160 | 260 | 320 | 210 |
| MTBF(hr) in SD PCT | 40 | 100 | 80 | 80 | 80 | 90 |

*Based on the resin.
**Per 100 parts by weight of the phenolic resin.
***Preliminarily reacted with the epoxy or phenolic resin.
****Preliminarily mixed with the resin.

It can be seen from Table 2 that the packages according the present invention show significantly high adhesion between the semi-conductor chip and the molding resin and that an SiO peak appears in either of the semi-conductor chip and the molding resin after separation. In addition, when epoxy resin compositions having a bending modulus of elasticity of 300 Kgf/mm$^2$ or less at 170° C. were employed, the results of PCT after solder-dipping are very excellent, indicating markedly increased moisture resistant reliability after surface-mounting.

While the invention has been described in detail and with reference to specific embodiments thereof, it will be apparent to one skilled in the art that various changes and modifications can be made therein without departing from the spirit and scope thereof.

What is claimed is:

1. A semi-conductor device comprising a semi-conductor element sealed with a molding resin, wherein
   said molding resin is a cured epoxy resin composition comprising an epoxy resin, a curing agent which is a phenolic resin modified by preliminary reaction with a silane compound, and an inorganic filler, and
   adhesion between a semi-conductor chip in the semi-conductor device and said molding resin is achieved mainly by oxygen-crosslinking between silicon in said semi-conductor chip and silicon in said molding resin.

2. A semi-conductor device as in claim 1, wherein said molding resin has a bending modulus of elasticity of from 50 to 300 Kgf/mm$^2$ at 170° C.

3. A semi-conductor device as in claim 1, wherein said epoxy resin is modified with a silane compound.

* * * * *